United States Patent
Watanabe et al.

(10) Patent No.: US 10,574,514 B2
(45) Date of Patent: Feb. 25, 2020

(54) DUPLEX CONTROL DEVICE AND DUPLEX SYSTEM

(71) Applicant: YOKOGAWA ELECTRIC CORPORATION, Musashino-shi, Tokyo (JP)

(72) Inventors: Ikutomo Watanabe, Musashino (JP); Yukio Maniwa, Musashino (JP)

(73) Assignee: Yokogawa Electric Corporation, Musashino-shi, Tokyo (JP)

(*) Notice: Subject to any disclaimer, the term of this patent is extended or adjusted under 35 U.S.C. 154(b) by 395 days.

(21) Appl. No.: 15/346,084

(22) Filed: Nov. 8, 2016

(65) Prior Publication Data
US 2017/0155546 A1  Jun. 1, 2017

(30) Foreign Application Priority Data
Nov. 30, 2015 (JP) ................... 2015-233594

(51) Int. Cl.
| H04L 12/24 | (2006.01) |
| H04L 1/00 | (2006.01) |
| G05B 23/02 | (2006.01) |
| H03K 17/567 | (2006.01) |

(52) U.S. Cl.
CPC ...... *H04L 41/0672* (2013.01); *G05B 23/0237* (2013.01); *H03K 17/567* (2013.01); *H04L 1/00* (2013.01)

(58) Field of Classification Search
CPC .... G05B 23/0237; H03K 17/567; H04L 1/00; H04L 41/0672
USPC .......................................... 370/216
See application file for complete search history.

(56) References Cited

U.S. PATENT DOCUMENTS

| 3,560,829 A * | 2/1971 | Brennan | G05D 3/18 318/599 |
| 2005/0062733 A1* | 3/2005 | Morita | G09G 3/3688 345/204 |
| 2006/0221817 A1* | 10/2006 | Nishida | G06F 11/004 370/216 |
| 2008/0166981 A1* | 7/2008 | Prikhodko | H01P 1/15 455/83 |
| 2012/0181946 A1* | 7/2012 | Melanson | H03K 17/18 315/247 |
| 2013/0094349 A1* | 4/2013 | Hoshino | H04L 1/1893 370/216 |

FOREIGN PATENT DOCUMENTS

| JP | 2000-222001 A | 8/2000 |
| JP | 2014-135580 A | 7/2014 |
| JP | 2014135580 A * | 7/2014 |
| KR | 20170036906 A1 * | 4/2017 |

* cited by examiner

*Primary Examiner* — Mark H Rinehart
*Assistant Examiner* — Kokou R Detse
(74) *Attorney, Agent, or Firm* — Sughrue Mion, PLLC

(57) ABSTRACT

A duplex control device includes: two systems of duplex controllers and a switching device. The switching device includes, in a feedback path of each system, a transmitter configured to generate feedback data including data for fixing failure detection and a receiving device configured to determine the presence or absence of a fixing failure based on the feedback data output from the transmitter.

13 Claims, 5 Drawing Sheets

DUPLEX CONTROL DEVICE AND DUPLEX SYSTEM

CROSS-REFERENCE TO RELATED APPLICATION

This application claims priority from Japanese Patent Application No. 2015-233594 filed with the Japan Patent Office on Nov. 30, 2015, the entire content of which is hereby incorporated by reference.

BACKGROUND

1. Technical Field

The present disclosure relates to a duplex control device and a duplex system.

2. Description of the Related Art

As one of the techniques for enhancing reliability of a device, a duplex method has been employed. In a duplex system, one system is set as a service side for executing practical operations, while the other system is set as a stand-by side. If a failure is found in the service side, the system that is in charge of the practical operations is switched to the stand-by side.

FIG. 6 illustrates an example of a configuration of a typical duplex system 300. In this example, a current output device for outputting a 4-mA to 20-mA current corresponding to a manipulated value MV is duplexed. The duplexing in this example is realized by a current output device A 310a and a current output device B 310b. The current output device A 310a and the current output device B 310b have an identical configuration, and receive an identical manipulated value MV. Thus, the current output device B 310b will be described in a simplified manner.

The duplex system 300 includes a duplex controller A 320a, which monitors operation of the current output device A 310a, and a duplex controller B 320b, which monitors operation of the current output device B 310b. Both of the duplex controller A 320a and the duplex controller B 320b are connected to a higher level system that controls the duplex system 300.

The duplex controller A 320a monitors operation of the current output device A 310a. When the current output device A 310a is normal, the duplex controller A 320a sets a level of a ReqA signal, which requests a control right, at H. When abnormality in the current output device A 310a is detected, the duplex controller A 320a sets the level of the ReqA signal at L. The duplex controller B 320b monitors operation of the current output device B 310b. When the current output device B 310b is normal, the duplex controller B 320b sets a level of a ReqB signal, which requests the control right, at H. When abnormality in the current output device B 310b is detected, the duplex controller B 320b sets the level of the ReqB signal at L.

The duplex system 300 includes a switching device 330. The switching device 330 switches, between the current output device A 310a and the current output device B 310b, a current output device to serve as the service side (or as the stand-by side). The switching device 330 receives the ReqA signal and the ReqB signal. Further, the switching device 330 outputs a ServiceA signal to the current output device A 310a, and outputs a ServiceB signal to the current output device B 310b.

The switching device 330 may include an SR latch circuit. In the example shown in FIG. 6, the switching device 330 includes a negative logic SR latch circuit that includes a NAND gate G1 and a NAND gate G2.

Namely, the NAND gate G1 receives the ReqA signal and the ServiceB signal that is an output from the NAND gate G2, and outputs the ServiceA signal. The NAND gate G2 receives the ReqB signal and the ServiceA signal that is an output from the NAND gate G1, and outputs the ServiceB signal.

A path for feeding back, to the NAND gate G2, the ServiceA signal that is output from the NAND gate G1 is referred to as "fbA." A path for feeding back, to the NAND gate G1, the ServiceB signal that is output from the NAND gate G2 is referred to as "fbB."

In the current output device A 310a, when the level of the ServiceA signal is L, a transistor Tr1 is off. Therefore, in this state, the current output device A 310a serves as the service side for outputting a 4-mA to 20-mA current corresponding to a manipulated value MV. Meanwhile, when the level of the ServiceA signal is H, the transistor Tr1 is on. Therefore, in this state, the current output device A 310a does not output the current, and serves as the stand-by side. When the level of the ServiceB signal is L, the current output device B 310b serves as the service side. Meanwhile, when the level of the ServiceB signal is H, the current output device B 310b serves as the stand-by side.

When both of the current output device A 310a and the current output device B 310b are normal, one of the duplex controller A 320a and the duplex controller B 320b requests the control right ahead of the other, under control of the higher level system. When the duplex controller A 320a requests the control right ahead of the duplex controller B 320b, the level of the ReqA signal becomes H and the level of the ReqB signal becomes L.

This allows the level of the ServiceA signal to be at L stably, and allows the level of the ServiceB signal to be at H stably. As a result, the current output device A 310a serves as the service side, and the current output device B 310b serves as the stand-by side.

If the duplex controller B 320b requests the control right thereafter, the levels of both of the ReqA signal and the ReqB signal become H. In this state, the output state of the switching device 330 is maintained. Thus, the current output device A 310a continues serving as the service side, and the current output device B 310b continues serving as the stand-by side.

If the duplex controller A 320a, which is in the service side, detects abnormality in the current output device A 310a while the duplex system 300 is operating, the duplex controller A 320a abandons the control right and sets the level of the ReqA signal at L. Consequently, the level of the ServiceA signal is inverted to H, and the level of the ServiceB signal is inverted to L. As a result, the current output device B 310b serves as the service side, and the current output device A 310a serves as the stand-by side. This allows the duplex system 300 to continue operating without stopping the service.

Further, the duplex controller A 320a notifies the abnormality in the current output device A 310a to the higher level system. Consequently, while the current output device B 310b serves as the service side, the current output device A 310a can be repaired or exchanged. Further, after that, the duplex controller A 320a can request the control right again. This allows the current output device A 310a to be immediately switched to the service side even if abnormality in the current output device B 310b is detected thereafter. This allows the duplex system 300 to continue operating without stopping the service.

On the other hand, if the duplex controller B 320b, which is in the stand-by side, detects abnormality in the current output device B 310*b*, the duplex controller B 320*b* sets the level of the ReqB signal at L. In this state, the output state of the switching device 330 is maintained. This allows the current output device A 310*a* to continue working as the service side.

Further, the duplex controller B 320*b* notifies the abnormality in the current output device B 310*b* to the higher level system. Consequently, while the current output device A 310*a* serves as the service side, the current output device B 310*b* can be repaired or exchanged. Further, after that, the duplex controller B 320*b* can request the control right again. This allows the current output device B 310*b* to be immediately switched to the service side even if abnormality in the current output device A 310*a* is detected thereafter. This allows the duplex system 300 to continue operating without stopping the service.

Examples of the documents related to such a technique encompass JP-A-2000-222001.

SUMMARY

A duplex control device includes: a first duplex controller configured to output a first request signal for requesting a control right; a second duplex controller configured to output a second request signal for requesting a control right; and a switching device configured to receive the first request signal and the second request signal and to output a first service signal and a second service signal, the switching device including: a first gate configured to receive the first request signal and a second input signal that is based on the second service signal and to output the first service signal; a second gate configured to receive the second request signal and a first input signal that is based on the first service signal and to output the second service signal; a first transmitter configured to generate first feedback data including the first service signal and data for fixing failure detection; a second receiving device configured to determine the presence or absence of a fixing failure based on the first feedback data output from the first transmitter, to generate the first input signal by use of the first feedback data, and to output the first input signal to the second gate; a second transmitter configured to generate second feedback data including the second service signal and data for fixing failure detection; and a first receiving device configured to determine the presence or absence of a fixing failure based on the second feedback data output from the second transmitter, to generate the second input signal by use of the second feedback data, and to output the second input signal to the first gate.

DESCRIPTION OF THE EMBODIMENTS

Figure 1:
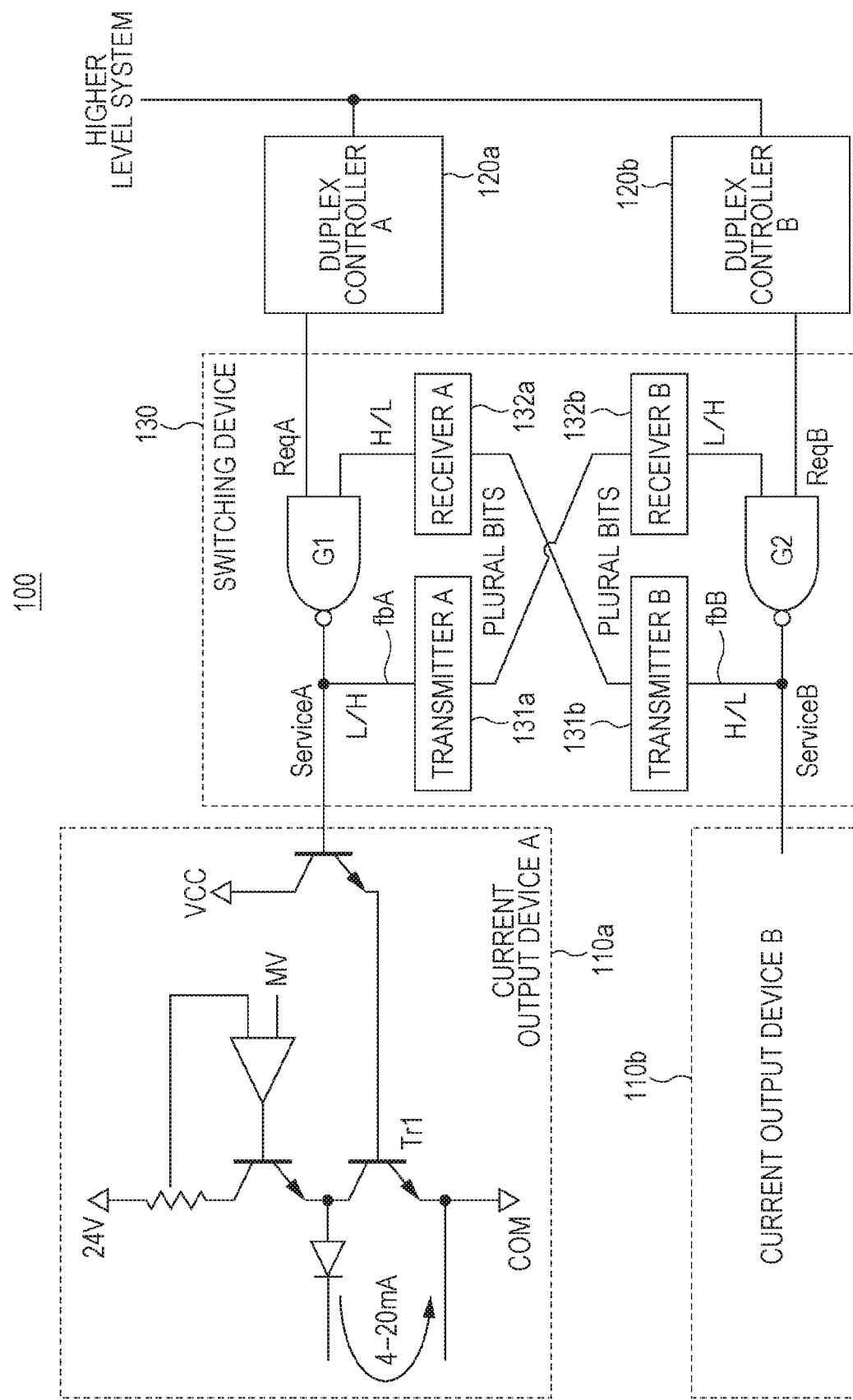
FIG. 1 illustrates an example of a configuration of a duplex system according to an embodiment.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 6:
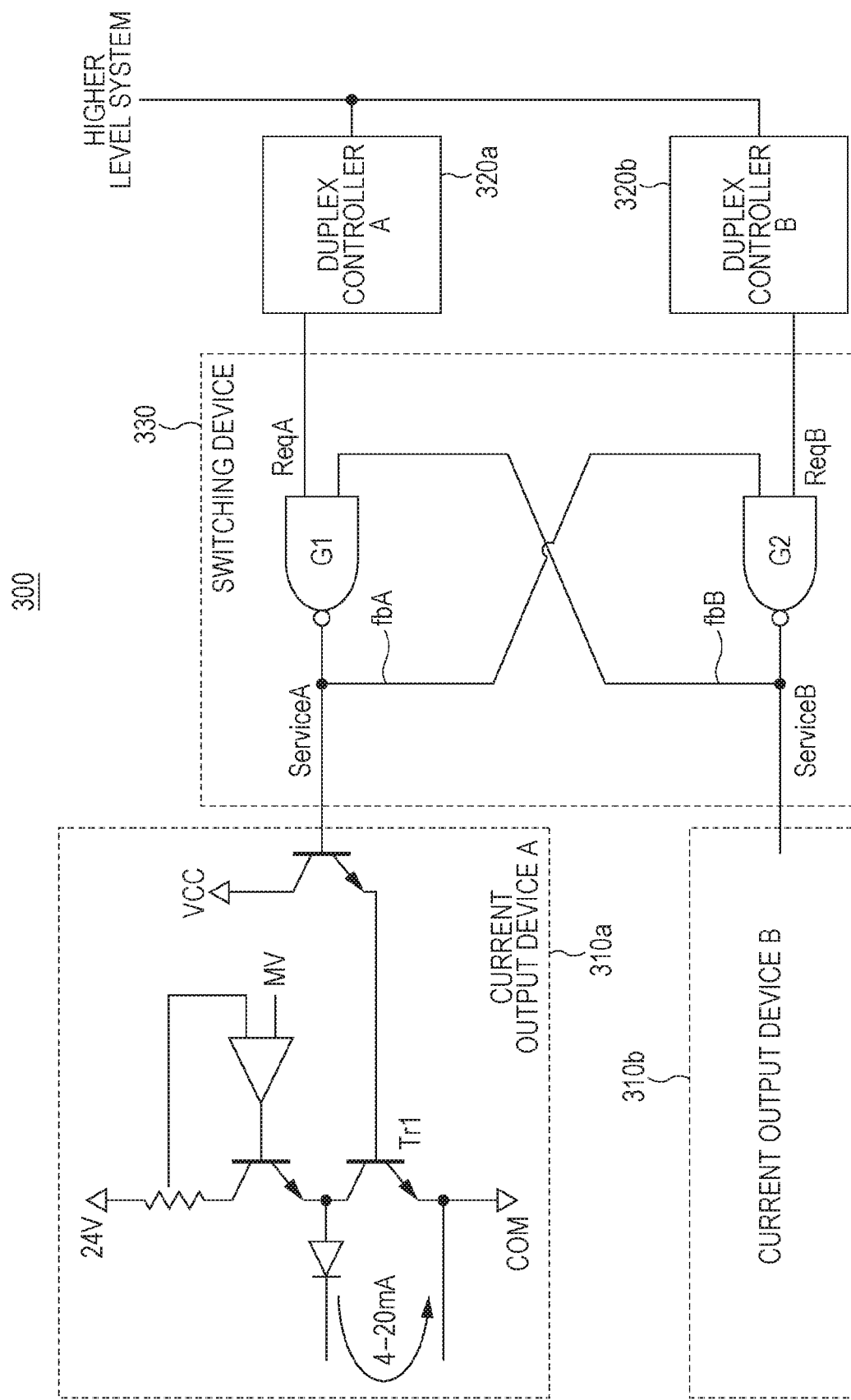
FIG. 6 illustrates an example of a configuration of a typical duplex system.

In the example shown in FIG. 6, the current output devices 310, which are arranged for duplexing, are monitored by the respective duplex controllers 320. Therefore, even if abnormality occurs in one of the current output devices 310, the abnormality is immediately detected and dealt with. Thus, in many cases, the occurrence of the abnormality does not affect continuous operation of the duplex system 300.

However, the above technique does not monitor the switching device 330, in which no change occurs in a transmission signal in a normal state. Therefore, if a fixing failure, which causes a level of the transmission signal (or a level of voltage or current) to be fixed at H (high) or L (low), in one of the feedback paths of the switching device 330, abnormality occurs in one of the current output devices 310 that serves as the service side. This abnormality does not become apparent until switching between the service side and the stand-by side is executed.

For example, assume that a fixing failure occurs in the feedback path fbA while the current output device A 310*a* serves as the service side. In this state, even if abnormality in the current output device A 310*a*, which serves as the service side, is detected and the duplex controller A 320*a* abandons the control right so as to change the level of the ServiceA signal to H, this signal is not transmitted to the NAND gate G2. Thus, the current output device B 310*b* cannot be switched to the service side. As a result, the duplex system 300 stops operating.

As described above, if the fixing failure is left in one of the feedback paths of the switching device 330, it becomes difficult to normally perform necessary switching for dealing with the abnormality occurred in the service side. This may largely affect an operation rate of the duplex system 300.

An object of the present disclosure is to detect a fixing failure in a switching device of a duplex system.

A duplex control device according to one aspect of the present disclosure (the present duplex control device) includes: a first duplex controller configured to output a first request signal for requesting a control right; a second duplex controller configured to output a second request signal for requesting a control right; and a switching device configured to receive the first request signal and the second request signal and to output a first service signal and a second service signal, the switching device including: a first gate configured to receive the first request signal and a second input signal that is based on the second service signal and to output the first service signal; a second gate configured to receive the second request signal and a first input signal that is based on the first service signal and to output the second service signal; a first transmitter configured to generate first feedback data including the first service signal and data for fixing failure detection; a second receiving device configured to determine the presence or absence of a fixing failure based on the first feedback data output from the first transmitter, to generate the first input signal by use of the first feedback data, and to output the first input signal to the second gate; a second transmitter configured to generate second feedback data including the second service signal and data for fixing failure detection; and a first receiving device configured to determine the presence or absence of a fixing failure based on the second feedback data output from the second transmitter, to generate the second input signal by use of the second feedback data, and to output the second input signal to the first gate.

In the present duplex control device, the second receiving device may include a second receiver configured to extract, from the first feedback data, the first service signal as the first input signal and to output the first service signal to the second gate. The first receiving device may include a first receiver configured to extract, from the second feedback data, the second service signal as the second input signal and to output the second service signal to the first gate.

In the present duplex control device, moreover, the first transmitter and the second receiver may be disposed in a first feedback path via which an output terminal of the first gate is connected to an input terminal of the second gate. The second transmitter and the first receiver may be disposed in a second feedback path via which an output terminal of the second gate is connected to an input terminal of the first gate. The second receiver may be configured to detect a fixing failure in the first feedback path based on the first feedback data. The first receiver may be configured to detect a fixing failure in the second feedback path based on the second feedback data.

In the present duplex control device, when the first receiver detects the fixing failure while the first duplex controller does not have the control right, the first receiver may output, to the first gate, the second input signal instead of the second service signal, the second input signal being configured to give the first duplex controller the control right. When the second receiver detects the fixing failure while the second duplex controller does not have the control right, the second receiver may output, to the second gate, the first input signal instead of the first service signal, the first input signal being configured to give the second duplex controller the control right.

In the present duplex control device, the first duplex controller may be configured to output a first Dpsel signal for designating a duplex operation or a single operation. The second duplex controller may be configured to output a second Dpsel signal for designating a duplex operation or a single operation. The second receiving device may include a second receiver and a fourth gate, the second receiver being configured to extract the first service signal from the first feedback data, the fourth gate being configured to generate the first input signal based on the second Dpsel signal and the first service signal and to output the first input signal to the second gate. The first receiving device may include a first receiver and a third gate, the first receiver being configured to extract the second service signal from the second feedback data, the third gate being configured to generate the second input signal based on the first Dpsel signal and the second service signal and to output the second input signal to the first gate.

In the present duplex control device, moreover, the data for fixing failure detection may be configured to allow the first and second feedback data to avoid including a predetermined number or more of consecutive bits having an identical value.

Moreover, a duplex system according to one aspect of the present disclosure includes: the present duplex control device; a first current output device configured such that it is controlled, based on the first service signal, whether the first current output device outputs a current or not; and a second current output device configured such that it is controlled, based on the second service signal, whether the second current output device outputs a current or not.

According to the present duplex control device, a fixing failure in the switching device of the duplex system is detectable.

With reference to the drawings, the following will describe an embodiment of the present disclosure. FIG. 1 illustrates an example of a configuration of a duplex system 100 according to the present embodiment. The present embodiment will be described by taking as an example the duplex system 100, in which a current output device for outputting a 4-mA to 20-mA current corresponding to a manipulated value MV is duplexed. Note that the embodiment of the present disclosure is not limited to the current output device. The embodiment of the present disclosure is applicable to a system in which any of various functional parts such as a digital signal output device and a voltage output device is duplexed.

As shown in FIG. 1, duplexing in the duplex system 100 of the present embodiment is realized by a current output device A 110a and a current output device B 110b. The current output device A 110a and the current output device B 110b have an identical configuration, and receive an identical manipulated value MV. Thus, the current output device B 110b will be described in a simplified manner.

Hereinafter, the current output device A 110a side is referred to as "system A", and the current output device B 110b side is referred to as "system B." In cases where descriptions can be made without discrimination between the current output device A 110a and the current output device B 110b, each of the current output device A 110a and the current output device B 110b is referred to as "current output device 110." This applies to other elements.

The duplex system 100 includes a duplex controller (first duplex controller) A 120a, which monitors operation of the current output device A 110a, and a duplex controller (second duplex controller) B 120b, which monitors operation of the current output device B 110b. Both of the duplex controller A 120a and the duplex controller B 120b are connected to a higher level system that controls the duplex system 100.

The duplex controller A 120a monitors operation of the current output device A 110a. When the current output device A 110a is normal, the duplex controller A 120a sets a level of a ReqA signal (first request signal), which requests a control right, at H. When abnormality in the current output device A 110a is detected, the duplex controller A 120a sets the level of the ReqA signal at L. The duplex controller B 120b monitors operation of the current output device B 110b. When the current output device B 110b is normal, the duplex controller B 120b sets a level of a ReqB signal (second request signal), which requests the control right, at H. When abnormality in the current output device B 110b is detected, the duplex controller B 120b sets the level of the ReqB signal at L.

The duplex system 100 includes a switching device 130. The switching device 130 switches, between the current output device A 110a and the current output device B 110b, a current output device to serve as the service side (or as the stand-by side). The switching device 130 receives the ReqA signal and the ReqB signal. Further, the switching device 130 outputs a ServiceA signal (first service signal) to the current output device A 110a, and outputs a ServiceB signal (second service signal) to the current output device B 110b. The duplex control device includes the duplex controller A 120a, the duplex controller B 120b, and the switching device 130.

The switching device 130 may include an SR latch circuit. In the example shown in FIG. 1, the switching device 130 includes a negative logic SR latch circuit that includes a NAND gate G1 in system A and a NAND gate G2 in system B. The switching device 130 may be configured in hardware or software.

Namely, the NAND gate G1 receives the ReqA signal and the ServiceB signal that is an output from the NAND gate G2, and outputs the ServiceA signal. The NAND gate G2 receives the ReqB signal and the ServiceA signal that is an output from the NAND gate G1, and outputs the ServiceB signal.

A path for feeding back, to the NAND gate G2, the ServiceA signal that is output from the NAND gate G1 is referred to as "fbA." A path for feeding back, to the NAND gate G1, the ServiceB signal that is output from the NAND gate G2 is referred to as "fbB."

As described later, according to the present embodiment, the feedback path fbA includes a transmitter A 131a and a receiver B 132b, and the feedback path fbB includes a transmitter B 131b and a receiver A 132a. The transmitter A 131a and the receiver A 132a belong to system A. The transmitter B 131b and the receiver B 132b belong to system B.

In the current output device A 110a (first current output device), when the level of the ServiceA signal is L, a transistor Tr1 is off. Therefore, in this state, the current output device A 110a serves as the service side for outputting a 4-mA to 20-mA current corresponding to a manipulated value MV. Meanwhile, when the level of the ServiceA signal is H, the transistor Tr1 is on. Therefore, in this state, the current output device A 110a does not output the current, and serves as the stand-by side. When the level of the ServiceB signal is L, the current output device B 110b (second current output device) serves as the service side. Meanwhile, when the level of the ServiceB signal is H, the current output device B 110b serves as the stand-by side. In this manner, it is controlled (switched), based on the ServiceA signal, whether the current output device A 110a outputs the current or not. Moreover, it is controlled (switched), based on the ServiceB signal, whether the current output device B 110b outputs the current or not.

The following will describe details of the basic operation of the duplex system 100. When both of the current output device A 110a and the current output device B 110b are normal, one of the duplex controller A 120a and the duplex controller B 120b requests the control right ahead of the other, under control of the higher level system. When the duplex controller A 120a requests the control right ahead of the duplex controller B 120b, the level of the ReqA signal becomes H and the level of the ReqB signal becomes L.

This allows the level of the ServiceA signal to be at L stably, and allows the level of the ServiceB signal to be at H stably. As a result, the current output device A 110a serves as the service side, and the current output device B 110b serves as the stand-by side.

If the duplex controller B 120b requests the control right thereafter, the levels of both of the ReqA signal and the ReqB signal become H. In this state, the output state of the switching device 130 is maintained. Thus, the current output device A 110a continues serving as the service side, and the current output device B 110b continues serving as the stand-by side.

If the duplex controller A 120a, which is in the service side, detects abnormality in the current output device A 110a while the duplex system 100 is operating, the duplex controller A 120a abandons the control right and sets the level of the ReqA signal at L. Consequently, the level of the ServiceA signal is inverted to H, and the level of the ServiceB signal is inverted to L. As a result, the current output device B 110b serves as the service side, and the current output device A 110a serves as the stand-by side. This allows the duplex system 100 to continue operating without stopping the service.

Further, the duplex controller A 120a notifies the abnormality in the current output device A 110a to the higher level system. Consequently, while the current output device B 110b serves as the service side, the current output device A 110a can be repaired or exchanged. Further, after that, the duplex controller A 120a can request the control right again. This allows the current output device A 110a to be immediately switched to the service side even if abnormality in the current output device B 110b is detected thereafter. This allows the duplex system 100 to continue operating without stopping the service.

On the other hand, if the duplex controller B 120b, which is in the stand-by side, detects abnormality in the current output device B 110b, the duplex controller B 120b sets the level of the ReqB signal at L. In this state, the output state of the switching device 130 is maintained. This allows the current output device A 110a to continue working as the service side.

Further, the duplex controller B 120b notifies the abnormality in the current output device B 110b to the higher level system. Consequently, while the current output device A 110a serves as the service side, the current output device B 110b can be repaired or exchanged. Further, after that, the duplex controller B 120b can request the control right again. This allows the current output device B 110b to be immediately switched to the service side even if abnormality in the current output device A 110a is detected thereafter. This allows the duplex system 100 to continue operating without stopping the service.

Next, the following will describe details of the switching device 130. The above-described operation is based on the assumption that no fixing failure occurs in any of the feedback paths of the switching device 130. Typically, in some cases, if a fixing failure occurs in one of the feedback paths, switching between the current output devices 110 may not be performed, and consequently it may become difficult for the duplex system 100 to continue operating.

According to the present embodiment, the feedback path (first feedback path) fbA includes the transmitter A 131a and the receiver B 132b. Via the feedback path fbA, an output terminal of the NAND gate (first gate) G1 is connected to an input terminal of the NAND gate (second gate) G2. Further, the feedback path (second feedback path) fbB includes the transmitter B 131b and the receiver A 132a. Via the feedback path fbB, an output terminal of the NAND gate G2 is connected to an input terminal of the NAND gate G1. With this configuration, a fixing failure is detectable in the duplex system 100. The transmitter A 131a and the receiver A 132a are disposed on the NAND gate G1 side, i.e., in system A (first system). The transmitter B 131b and the receiver B 132b are disposed on the NAND gate G2 side, i.e., in system B (second system).

The transmitter A 131a generates serial data of plural bits (first feedback data) by adding predetermined information to the ServiceA signal, which is one-bit information. The transmitter A 131a transmits the serial data of plural bits to the receiver B 132b. The receiver B (second receiver, second receiving device) 132b diagnoses a fixing failure in the feedback path fbA based on the received serial data of plural bits. Furthermore, the receiver B 132b extracts the ServiceA signal (first input signal, first service signal) from the serial data, and inputs the ServiceA signal to the NAND gate G2.

Namely, the receiver B 132*b* functions as the second receiving device, which is configured to determine the presence or absence of a fixing failure in the feedback path fbA based on the first feedback data output from the transmitter A 131*a*, to generate (extract) the first input signal (ServiceA signal) by use of the first feedback data, and to output the first input signal to the NAND gate G2 in system B.

The transmitter B 131*b* generates serial data of plural bits (second feedback data) by adding predetermined information to the ServiceB signal, which is one-bit information. The transmitter B 131*b* transmits the serial data of plural bits to the receiver A 132*a*. The receiver A (first receiver, first receiving device) 132*a* diagnoses a fixing failure in the feedback path fbB based on the received serial data of plural bits. Furthermore, the receiver A 132*a* extracts the ServiceB signal (second input signal, second service signal) from the serial data, and inputs the ServiceB signal to the NAND gate G1.

Namely, the receiver A 132*a* functions as the first receiving device, which is configured to determine the presence or absence of a fixing failure in the feedback path fbB based on the second feedback data output from the transmitter B 131*b*, to generate (extract) the second input signal (ServiceB signal) by use of the second feedback data, and to output the second input signal to the NAND gate G1 in system A.

The "predetermined information" described above includes data for fixing failure detection. The data for fixing failure detection is information for allowing the serial data (feedback data) transmitted from the transmitter 131 to the receiver 132 to avoid including a predetermined number or more of consecutive bits having an identical value. The data for fixing failure detection is information that is constituted by one or plural bits. Examples of the information included in the data for fixing failure detection encompass a count value, time information, information obtained by inverting a bit of a service signal, information of "0" and "1" changed alternately frame by frame, and information including two bits of "01" or "10." Further, an IDLE signal state, which is a state of a high-level signal or a state without a carrier signal, may be provided as the data for fixing failure detection between the frames of the serial data.

With this configuration, when the received serial data includes a predetermined number or more of consecutive bits having an identical value, the receiver 132 determines that a fixing failure occurs in the feedback path fbA or the feedback path fbB.

Namely, when a fixing failure occurs in the feedback path fbA or the feedback path fbB, for example, serial data that is output from the transmitter 131 does not include the data for fixing failure detection and has a level fixed at H or L. In this case, the serial data includes a predetermined number or more of consecutive bits having an identical value. Thus, in this case, the receiver 132 determines that the serial data includes the predetermined number or more of consecutive bits having an identical value. Further, based on the determination, the receiver 132 determines the occurrence of the fixing failure.

Figure 2:
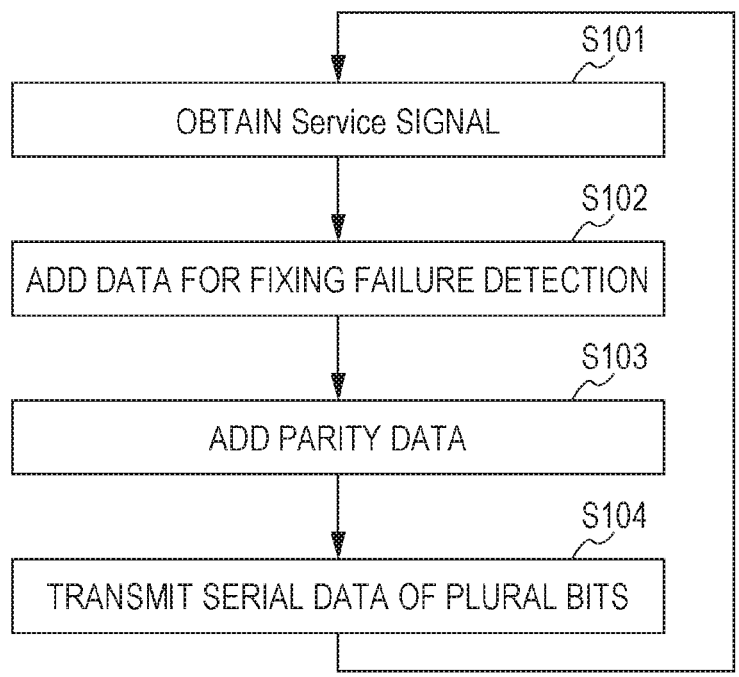
FIG. 2 is a flowchart illustrating how a transmitter operates.

FIG. 2 is a flowchart illustrating how the transmitter 131 operates. The transmitter 131 obtains a service signal that is output from a NAND gate of one system to which the transmitter 131 belongs (S101). Then, the transmitter 131 adds data for fixing failure detection to the service signal (S102). As described above, the data for fixing failure detection is information for allowing serial data output from the transmitter 131 to avoid including a predetermined number or more of consecutive bits having an identical value. The predetermined number or more of consecutive bits may be positioned across a plurality of frames.

Further, in the present embodiment, in order to enhance reliability of transmission/reception data, the transmitter 131 further adds parity data to the service signal (S103). In this manner, the transmitter 131 generates serial data of plural bits. The transmitter 131 transmits the serial data to a receiver 132 in the other system (S104). The transmitter 131 repeatedly performs the processes from (S101) to (S104) at a predetermined interval.

Figure 3:
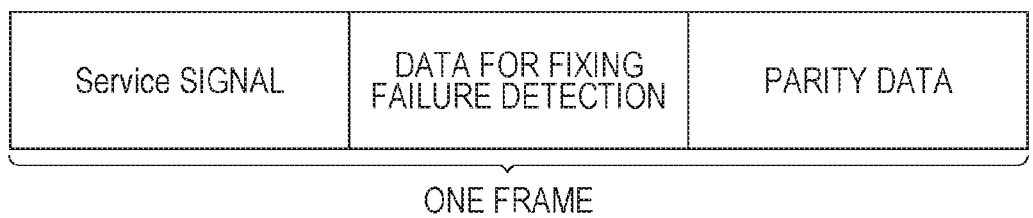
FIG. 3 illustrates an example of a frame configuration of serial data of plural bits.

FIG. 3 illustrates an example of one frame of serial data of plural bits, the serial data being generated by the transmitter 131. As shown in FIG. 3, the one frame of the serial data of plural bits includes the service signal, the data for fixing failure detection, and the parity data that are arranged in this order. Note that the order of the arrangement may be changed. Further, the transmitter 131 may add other information to the one frame of the serial data of plural bits. Furthermore, the transmitter 131 may not add the parity data to the one frame of the serial data of plural bits. Moreover, the transmitter 131 may generate the serial data such that the data for fixing failure detection indicates a delimiter of the frame.

Figure 4:
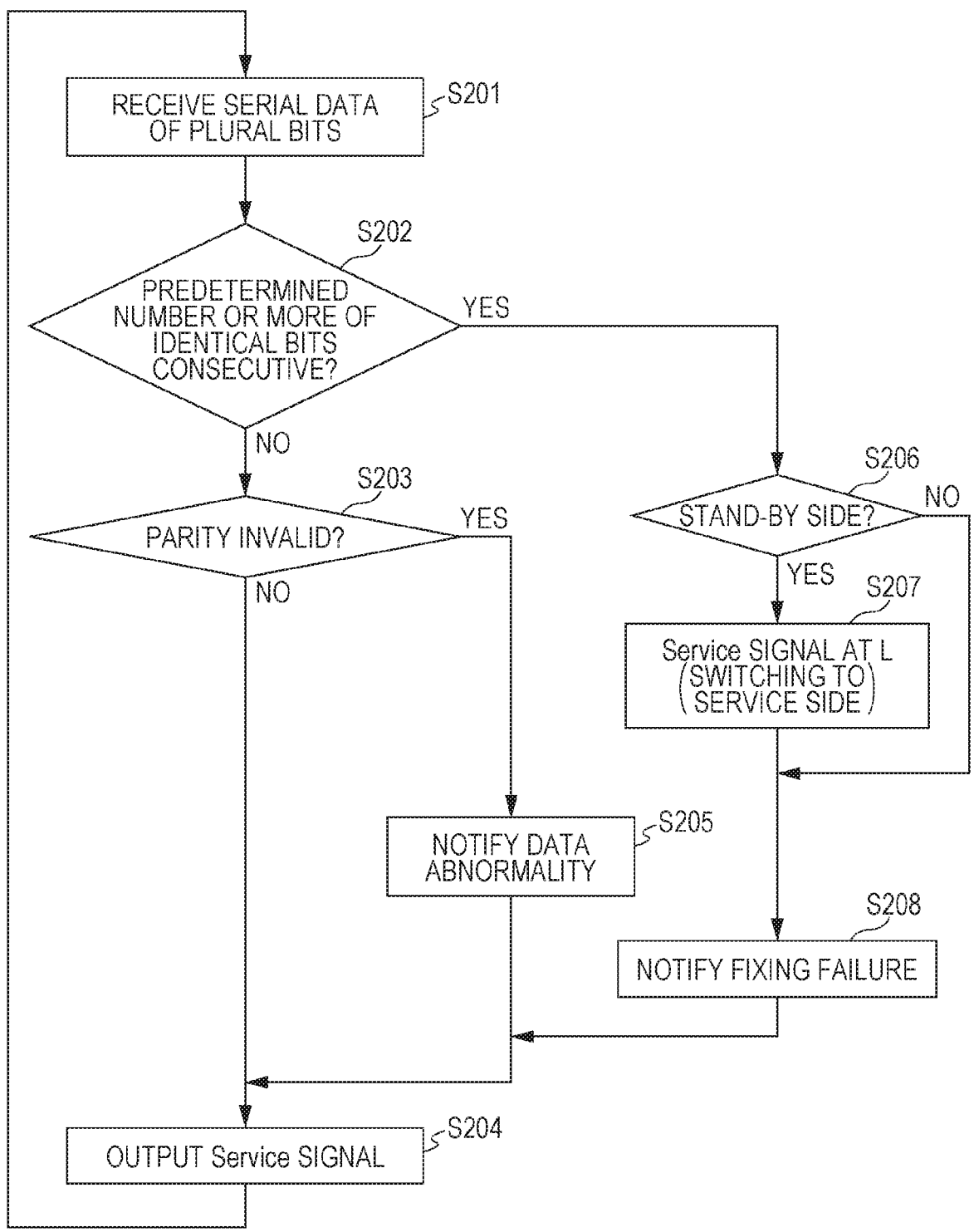
FIG. 4 is a flowchart illustrating how a receiver operates.

FIG. 4 is a flowchart illustrating how the receiver 132 operates. A receiver 132 receives serial data of plural bits from a transmitter 131 in the other system, to which the receiver 132 does not belong (S201). The receiver 132 determines whether the serial data of plural bits includes a predetermined number or more of consecutive bits having an identical value (S202). The "predetermined number" is larger than the number of bits that cannot be consecutive having an identical value due to the data for fixing failure detection. It is desirable that the "predetermined number" be at least larger than a difference obtained by subtracting the number of bits in the data for fixing failure detection from the number of bits in one frame. For example, the "predetermined number" may be the number of bits constituting one frame.

If the serial data of plural bits does not include a predetermined number or more of consecutive bits having an identical value (S202: No), the receiver 132 determines that no fixing failure occurs. After that, the receiver 132 performs parity check with use of the parity data (S203).

As a result of the parity check, if the parity is not invalid (S203: No), the receiver 132 determines that feedback paths and operation of the transmitter 131 are normal. Then, the receiver 132 extracts a service signal from the serial data of plural bits, and outputs the service signal to a NAND gate in the one system (S204).

On the other hand, if the parity is invalid (S203: Yes), the receiver 132 determines that no fixing failure occurs but the transmission data has abnormality. The receiver 132 notifies the abnormality in the transmission data to a duplex controller 120 in the one system (S205). The duplex controller 120 notifies the abnormality in the transmission data to a higher level system. This makes it possible for a user (operator) to determine that a feedback path including the transmitter 131 may have abnormality and to check the feedback path. Also in this case, the receiver 132 extracts a service signal from the serial data of plural bits, and outputs the service signal to the NAND gate in the one system (S204).

If the serial data of plural bits includes a predetermined number or more of consecutive bits having an identical value (S202: Yes), the receiver 132 determines that a fixing failure occurs in the feedback path in which the receiver 132 is included. For example, in a case where the receiver 132 is the receiver B 132*b*, the receiver B 132*b* determines that a fixing failure occurs in the feedback path fbA. Meanwhile, in a case where the receiver 132 is the receiver A 132*a*, the receiver A 132*a* determines that a fixing failure occurs in the feedback path fbB.

Further, if the one system to which the receiver 132 belongs is the stand-by side (S206: Yes), the receiver 132 operates the NAND gate in the one system so that a level of the service signal output from the NAND gate is changed to L (S207). Specifically, the receiver 132 outputs an H-level signal to an input terminal of the NAND gate in the one system. Since a Req signal in the one system has H level, the NAND gate in the one system outputs a service signal having L level. As a result, a current output device 110 in the one system is switched to the service side.

In the present embodiment, a level of a Req signal in the stand-by side is preset at H. Namely, if the level of the Req signal in the stand-by side is at L, the current output device 110 in the one system cannot be switched to the service side due to a fixing failure in the feedback path even when abnormality occurs in a current output device 110 in the other system, which serves as the service side. In order to avoid this, the level of the Req signal in the stand-by side is preset at H.

Thus, in the present embodiment, if the receiver A 132*a* detects a fixing failure in the feedback path fbB while the duplex controller A 120*a* does not have the control right, the receiver A 132*a* outputs a second input signal (H-level signal) to the NAND gate G1 instead of the ServiceB signal, the second input signal being configured to give the duplex controller A 120*a* the control right.

Further, if the receiver B 132*b* detects a fixing failure in the feedback path fbA while the duplex controller B 120*b* does not have the control right, the receiver B 132*b* outputs a first input signal (H-level signal) to the NAND gate G2 instead of the ServiceA signal, the first input signal being configured to give the duplex controller B 120*b* the control right.

The service signal which is output from the NAND gate in the one system and whose level is changed to L is input to a NAND gate in the other system via a feedback path in the other system in which no fixing failure occurs. This allows the current output device 110 in the other system to be switched from the service side to the stand-by side.

Even if, after the switching, abnormality occurs in the current output device 110 that has been switched to the service side, switching between the service side and the stand-by side can be performed through the feedback path that is normal. This allows the duplex system 100 to continue operating without stopping the service.

For example, assume that the receiver B 132*b* detects a fixing failure in the feedback path fbA while the current output device B 110*b* serves as the stand-by side. In this case, the receiver B 132*b* causes a level of the ServiceB signal output from the NAND gate G2 to be changed to L. With this, the receiver B 132*b* switches the current output device A 110*a* to the stand-by side, and switches the current output device B 110*b* to the service side.

Even if, in this state, abnormality occurs in the current output device B 110*b* that has been switched to the service side, the duplex controller B 120*b* can switch the current output device B 110*b* to the stand-by side by setting the level of the ReqB signal at L and setting the level of the ServiceB at H. Further, the ServiceB signal having H level is input to the NAND gate G1 via the feedback path fbB, which is normal. As a result, the current output device A 110*a* is switched to the service side.

On the other hand, if the one system to which the receiver 132 belongs is the service side (S206: No), the receiver 132 continues operation as it is. Namely, in this state, even if abnormality occurs in the current output device 110 in the one system that serves as the service side, switching between the service side and the stand-by side can be performed through the feedback path that is normal. This allows the duplex system 100 to continue operating without stopping the service.

In either of the above cases, the receiver 132 notifies the occurrence of the fixing failure to the duplex controller 120 in the one system, and the duplex controller 120 notifies the occurrence of the fixing failure to the higher level system (S208). This makes it possible for a user to perform a repair to remove the fixing failure in the feedback path while the duplex system 100 continues operating without stopping the service.

Then, the receiver 132 extracts a service signal from the serial data of plural bits, and outputs the service signal to the NAND gate in the one system (S204).

As described above, according to the duplex system 100 of the present embodiment, a fixing failure in any of the feedback paths in the switching device 130 is detectable. Further, even if a fixing failure occurs in any of the feedback paths, the duplex system 100 of the present embodiment eliminates or minimizes effects on an operation rate of the system caused by the occurrence of the fixing failure.

Figure 5:
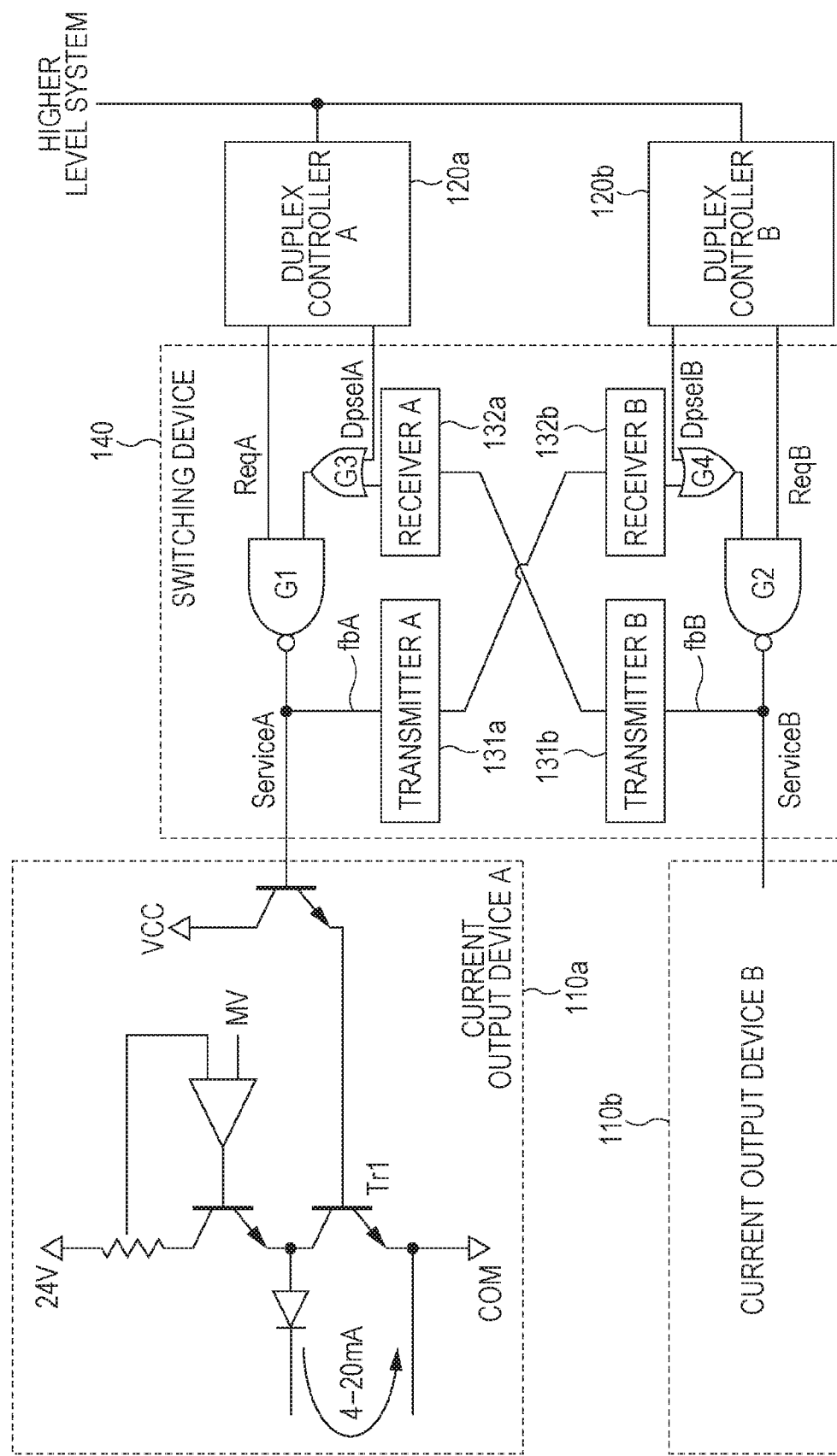
FIG. 5 is an example of a configuration of a duplex system according to another embodiment.

Note that embodiments of the present disclosure are not limited to the above-described embodiment. For example, as shown in FIG. 5, a duplex system 101 according to another embodiment of the present disclosure includes the configuration of the duplex system 100 shown in FIG. 1 in which a switching device 140 is provided instead of the switching device 130. The switching device 140 includes the configuration of the switching device 130 in which an OR gate G3 and an OR gate G4 are additionally provided.

The OR gate G3 receives an output signal from a receiver A 132*a* and a DpselA signal output from a duplex controller A 120*a*. The OR gate G3 outputs, to a NAND gate G1, ORs of these signals as an input signal for the NAND gate G1.

The OR gate G4 receives an output signal from a receiver B 132*b* and a DpselB signal output from a duplex controller B 120*b*. The OR gate G4 outputs, to a NAND gate G2, ORs of these signals as an input signal for the NAND gate G2.

According to this configuration, it is possible to designate, by the Dpsel signals, either of a mode in which the current output device A 110*a* and the current output device B 110*b* operate in a duplexed manner (duplex operation) or a mode in which the current output device A 110*a* and the current output device B 110*b* operate independently (single operation).

In this configuration, the duplex controllers 120 may set levels of both of the DpselA signal and the DpselB signal at L, so that the duplex system 101 can operate in a similar manner to the duplex system 100 of the above-described embodiment. Meanwhile, the duplex controllers 120 may set the levels of both of the DpselA signal and the DpselB signal at H, so that the duplex system 101 performs the single operation, in which the current output device A 110*a* and the current output device B 110*b* operate independently.

As described above, in the embodiment shown in FIG. 5, the duplex controller A 120*a* is configured to output the DpselA signal (first Dpsel signal) for designating a duplex operation or a single operation, and the duplex controller B 120*b* is configured to output the DpselB signal (second Dpsel signal) for designating a duplex operation or a single operation.

A second receiving device includes the receiver B 132*b* and the OR gate (fourth gate) G4. The receiver B 132*b* extracts a ServiceA signal from first feedback data. The OR gate G4 generates a first input signal based on the DpselB signal and the ServiceA signal, and outputs the first input signal to the NAND gate G2.

A first receiving device includes the receiver A 132*a* and the OR gate (third gate) G3. The receiver A 132*a* extracts a ServiceB signal from second feedback data. The OR gate G3 generates a second input signal based on the DpselA signal and the ServiceB signal, and outputs the second input signal to the NAND gate G1.

The transmitter 131 and the receiver 132 may have similar functions to those described in the embodiment illustrated in FIG. 1.

The present disclosure relates to a duplex control device. Further, the present disclosure can also relate to a duplex control device in which a fixing failure in a switching device is detectable.

The data for fixing failure detection may be information for avoiding a predetermined number of consecutive bits having an identical value.

With regard to the operation of the receiver 132 illustrated in FIG. 4, if the one system to which the receiver 132 belongs is the stand-by side (S206: Yes), the receiver 132 operates the NAND gate in the one system so that an output from the NAND gate is changed to L. Specifically, the receiver 132 outputs an H-level signal to the NAND gate in the one system. Since a Req signal in the one system has H level, the NAND gate in the one system outputs an L-level signal. As a result, the current output device 110 in the one system is switched to the service side. The switching the current output device 110 in the one system to the service side in advance is performed in order to avoid such a case that, if abnormality occurs in the current output device 110 in the other system serving as the service side, the current output device 110 in the one system cannot be switched to the service side due to the fixing failure in the feedback path.

A duplex control device according to the embodiments of the present disclosure may be any one of first to third duplex control devices described below.

The first duplex control device includes: a first duplex controller configured to output a first request signal for requesting a control right; a second duplex controller configured to output a second request signal for requesting the control right; and a switching device configured to receive the first request signal and the second request signal and to output a first service signal or a second service signal, the switching device including: a first gate configured to receive the first request signal and a signal that is based on the second service signal and to output the first service signal; a second gate configured to receive the second request signal and a signal that is based on the first service signal and to output the second service signal; a first transmitter configured to add data for fixing failure detection to the first service signal for output; a second receiver configured to receive output data from the first transmitter, to detect a fixing failure based on the data for fixing failure detection, and to extract and output the first service signal to the second gate; a second transmitter configured to add data for fixing failure detection to the second service signal for output; and a first receiver configured to receive output data from the second transmitter, to detect a fixing failure based on the data for fixing failure detection, and to extract and output the second service signal to the first gate.

The second duplex control device is configured such that, in the configuration of the first duplex control device, when the first receiver detects the fixing failure while the first gate is not outputting the service signal, the first receiver causes the first gate to output the service signal, and when the second receiver detects the fixing failure while the second gate is not outputting the service signal, the second receiver causes the second gate to output the service signal.

The third duplex control device is configured such that, in the configuration of the first or second duplex control device, the data for fixing failure detection avoids, in the data including the data for fixing failure detection that is added for output, a predetermined number of consecutive bits having an identical value.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A duplex control device comprising:
a first duplex controller configured to output a first request signal for requesting a control right;
a second duplex controller configured to output a second request signal for requesting a control right; and
a switching device configured to receive the first request signal and the second request signal and to output a first service signal and a second service signal,
the switching device including:
a first gate configured to receive the first request signal and a second input signal that is based on the second service signal and to output the first service signal;
a second gate configured to receive the second request signal and a first input signal that is based on the first service signal and to output the second service signal;
a first transmitter configured to generate first feedback data including the first service signal and data for fixing failure detection, and to transmit the generated first feedback data;
a second receiving device configured to determine the presence or absence of a fixing failure based on the first feedback data output and received from the first transmitter, to generate the first input signal by use of the first feedback data, and to output the first input signal to the second gate;
a second transmitter configured to generate second feedback data including the second service signal and data for fixing failure detection, and to transmit the generated second feedback data; and
a first receiving device configured to determine the presence or absence of a fixing failure based on the second feedback data output and received from the second transmitter, to generate the second input signal by use of the second feedback data, and to output the second input signal to the first gate.

2. The duplex control device according to claim 1, wherein
the second receiving device includes a second receiver configured to extract, from the first feedback data, the first service signal as the first input signal and to output the first service signal to the second gate, and the first receiving device includes a first receiver configured to extract, from the second feedback data, the second service signal as the second input signal and to output the second service signal to the first gate.

3. The duplex control device according to claim 2, wherein
the first transmitter and the second receiver are disposed in a first feedback path via which an output terminal of the first gate is connected to an input terminal of the second gate,
the second transmitter and the first receiver are disposed in a second feedback path via which an output terminal of the second gate is connected to an input terminal of the first gate,
the second receiver is configured to detect a fixing failure in the first feedback path based on the first feedback data, and
the first receiver is configured to detect a fixing failure in the second feedback path based on the second feedback data.

4. The duplex control device according to claim 2, wherein
when the first receiver detects the fixing failure while the first duplex controller does not have the control right, the first receiver outputs, to the first gate, the second input signal instead of the second service signal, the second input signal being configured to give the first duplex controller the control right, and
when the second receiver detects the fixing failure while the second duplex controller does not have the control right, the second receiver outputs, to the second gate, the first input signal instead of the first service signal, the first input signal being configured to give the second duplex controller the control right.

5. The duplex control device according to claim 3, wherein
when the first receiver detects the fixing failure while the first duplex controller does not have the control right, the first receiver outputs, to the first gate, the second input signal instead of the second service signal, the second input signal being configured to give the first duplex controller the control right, and
when the second receiver detects the fixing failure while the second duplex controller does not have the control right, the second receiver outputs, to the second gate, the first input signal instead of the first service signal, the first input signal being configured to give the second duplex controller the control right.

6. A duplex control device comprising:
a first duplex controller configured to output a first request signal for requesting a control right;
a second duplex controller configured to output a second request signal for requesting a control right; and
a switching device configured to receive the first request signal and the second request signal and to output a first service signal and a second service signal,
the switching device including:
a first gate configured to receive the first request signal and a second input signal that is based on the second service signal and to output the first service signal;
a second gate configured to receive the second request signal and a first input signal that is based on the first service signal and to output the second service signal;
a first transmitter configured to generate first feedback data including the first service signal and data for fixing failure detection;
a second receiving device configured to determine the presence or absence of a fixing failure based on the first feedback data output from the first transmitter, to generate the first input signal by use of the first feedback data, and to output the first input signal to the second gate;
a second transmitter configured to generate second feedback data including the second service signal and data for fixing failure detection; and
a first receiving device configured to determine the presence or absence of a fixing failure based on the second feedback data output from the second transmitter, to generate the second input signal by use of the second feedback data, and to output the second input signal to the first gate,
wherein
the first duplex controller is configured to output a first Dpsel signal for designating a duplex operation or a single operation,
the second duplex controller is configured to output a second Dpsel signal for designating a duplex operation or a single operation,
the second receiving device includes a second receiver and a fourth gate, the second receiver being configured to extract the first service signal from the first feedback data, the fourth gate being configured to generate the first input signal based on the second Dpsel signal and the first service signal and to output the first input signal to the second gate, and
the first receiving device includes a first receiver and a third gate, the first receiver being configured to extract the second service signal from the second feedback data, the third gate being configured to generate the second input signal based on the first Dpsel signal and the second service signal and to output the second input signal to the first gate.

7. The duplex control device according to claim 1, wherein
the data for fixing failure detection is configured to allow the first and second feedback data to avoid including a predetermined number or more of consecutive bits having an identical value.

8. The duplex control device according to claim 2, wherein
the data for fixing failure detection is configured to allow the first and second feedback data to avoid including a predetermined number or more of consecutive bits having an identical value.

9. The duplex control device according to claim 3, wherein
the data for fixing failure detection is configured to allow the first and second feedback data to avoid including a predetermined number or more of consecutive bits having an identical value.

10. The duplex control device according to claim 4, wherein
the data for fixing failure detection is configured to allow the first and second feedback data to avoid including a predetermined number or more of consecutive bits having an identical value.

11. The duplex control device according to claim 5, wherein
the data for fixing failure detection is configured to allow the first and second feedback data to avoid including a predetermined number or more of consecutive bits having an identical value.

12. The duplex control device according to claim 6, wherein
the data for fixing failure detection is configured to allow the first and second feedback data to avoid including a predetermined number or more of consecutive bits having an identical value.

13. A duplex system comprising:
the duplex control device according to claim 1;
a first current output device configured such that it is controlled, based on the first service signal, whether the first current output device outputs a current or not; and
a second current output device configured such that it is controlled, based on the second service signal, whether the second current output device outputs a current or not.

* * * * *